United States Patent [19]

Sham et al.

[11] Patent Number: 5,595,672
[45] Date of Patent: Jan. 21, 1997

[54] AUTOMATIC POWER INTERRUPTING APPARATUS FOR AN ELECTRIC APPLIANCE

[75] Inventors: John C. K. Sham, Hong Kong; Fan K. Leung, Pok fu lam, both of Hong Kong

[73] Assignee: Pentalpha Enterprises Ltd., Hong Kong

[21] Appl. No.: 245,964

[22] Filed: May 19, 1994

[51] Int. Cl.$^6$ .......................... H03K 17/96; D06F 75/26
[52] U.S. Cl. ................... 219/257; 219/509; 38/74
[58] Field of Search ........................ 219/257, 256, 219/250, 251, 492, 509, 240, 516; 38/74, 82; 307/141; 99/332, 337

[56] References Cited

U.S. PATENT DOCUMENTS

| | | |
|---|---|---|
| 3,970,846 | 7/1976 | Schofield, Jr. et al. . |
| 4,203,101 | 5/1980 | Towsend . |
| 4,415,796 | 11/1983 | Balchunas . |
| 4,418,268 | 11/1983 | Munshaw ........................ 219/247 |
| 4,482,845 | 11/1984 | Roylance et al. . |
| 4,520,257 | 5/1985 | Schwob et al. . |
| 4,523,079 | 6/1985 | Albinger, Jr. . |
| 4,536,641 | 8/1985 | Chan . |
| 4,546,235 | 10/1985 | Kolter ............................. 219/240 |
| 4,580,038 | 4/1986 | O'Loughlin ..................... 219/252 |
| 4,673,798 | 6/1987 | Contri et al. .................... 219/240 |
| 4,686,352 | 8/1987 | Nawrot et al. . |
| 4,692,589 | 9/1987 | Borsari et al. . |
| 4,727,240 | 2/1988 | Provolo et al. ................. 219/257 |
| 4,745,260 | 5/1988 | Albinger, Jr. et al. . |
| 4,803,342 | 2/1989 | Steers et al. . |
| 4,833,297 | 5/1989 | Del Fresno . |
| 4,859,869 | 8/1989 | Heuwinkel et al. . |
| 4,939,342 | 7/1990 | Frens et al. . |
| 5,039,843 | 8/1991 | Müller . |
| 5,042,179 | 8/1991 | van der Meer . |
| 5,160,831 | 11/1992 | Thaler et al. ................... 219/240 |

FOREIGN PATENT DOCUMENTS

| | | |
|---|---|---|
| 0290776 | 11/1988 | European Pat. Off. . |
| 2408967 | 10/1978 | France . |
| 61-280894 | 12/1985 | Japan ............................. 219/250 |
| 62-400 | 1/1987 | Japan ............................. 219/257 |
| 62-49899 | 3/1987 | Japan ............................. 219/257 |
| 62-101300 | 5/1987 | Japan ............................. 219/251 |
| 4-183498 | 6/1992 | Japan ............................. 219/251 |
| 2009973 | 6/1979 | United Kingdom . |
| 2179962 | 3/1987 | United Kingdom ............ 219/257 |
| 2199962 | 7/1988 | United Kingdom . |
| 8203520 | 10/1982 | WIPO ............................. 219/257 |

Primary Examiner—John A. Jeffery
Attorney, Agent, or Firm—Salzman & Levy

[57] ABSTRACT

An automatic switching apparatus for a hand held electrically operated appliance, such as a pressing iron, is provided within a circuit board located within the housing of the iron. The automatic switching apparatus includes a first timing circuit and a touch sensitive switch which function in conjunction with one another such that when the user breaks contact with the touch sensitive switch, located on the handle portion of the iron, the first timing circuit is enabled to de-energize the heating element of the iron after contact has been broken with the touch sensitive switch for a predetermined period of time. A second timing circuit is provided to disable the first timing circuit for a second predetermined period of time when the iron is initially plugged into the wall outlet so as to permit the heating element to reach a temperature level suitable for ironing without necessitating the user to contact the touch sensitive switch when the heating element is initially energized. A temperature sensitive circuit is further provided to de-energize the heating element at a predetermined temperature.

18 Claims, 2 Drawing Sheets

AUTOMATIC POWER INTERRUPTING APPARATUS FOR AN ELECTRIC APPLIANCE

BACKGROUND OF THE INVENTION

1. Field of the Invention

The present invention relates generally to an automatic power interrupting apparatus, and more particularly to an automatic switching circuit for use in an electric appliance. Further, the present invention also relates to a temperature control circuit for use in an electric appliance employing a heat driven element.

2. Description of the Related Art

Conventional electric pressing irons have been used for many years to press clothing and various textiles. Such conventional irons operate in that a sole plate component is heated to a sufficient temperature suitable to press and/or remove wrinkles from clothing or various textiles. It is well known in the prior art for pressing irons, and in particular the soleplate element, to be selectively controlled to operate at various temperature levels enabling different types of fabrics to be effectively ironed without causing damage. It is also well known that the efficiency of the iron directly correlates with the temperature of the sole plate element, such that it is desirable to iron a particular fabric at the highest temperature to which it can be subjected for a reasonable period of time without scorching. The conventional iron typically utilizes a bimetallic thermostatic control to regulate the temperature of the soleplate so as to be within the temperature operating range of a desired setting.

However, an inherent safety problem exists with the conventional household iron, in that the iron is prone to scorch clothing, cause fires or cause burns to a person who inadvertently contacts the heated soleplate of the iron. For example, an article of clothing can be scorched by the iron, when the heated soleplate of the iron is left in a horizontal position and remains in direct contact with the clothing for a prolonged period of time. Such an event commonly occurs when the attention of the user is directed away from the iron. Further, and more seriously, the aforementioned event may lead to effect the article of clothing to ignite in flames, potentially creating a fire in the household. Moreover, a person, commonly a child, may contact the energized heated soleplate of an unattended iron which is left to remain in an upstanding position, typically causing severe burns to such a person. Thus, a need has existed to provide an automatic power interrupting circuit in a conventional household iron to de-energize the heating element in the soleplate of the iron, when the iron is left unattended for a prolonged period of time.

An attempt to address the above-mentioned need was to provide a position/motion sensitive electrochemical switch, such as a mercury switch in the circuitry of the iron. Essentially, the mercury switch is operational to de-energize the heated element in the soleplate in the event the iron is left unattended for a prolonged period of time. Examples of such mercury switches can be found, in Townsend, U.S. Pat. No. 4,203,101; Nawrot et al., U.S. Pat. No. 4,686,352; Borsari et al., U.S. Pat. No. 4,692,589 and Albinger, Jr., U.S. Pat. No. 4,745,260. Briefly, an iron utilizing the aforementioned mercury switch functions such that when the iron is in a horizontal position and in motion, the mercury switch is closed to energize the heating element. However, if the iron is to remain motionless in such a horizontal position for a predetermined period of time, such as thirty (30) seconds, the control circuitry of the iron is configured to de-energize the soleplate until movement of the iron resumes. Further, if the iron is positioned in a vertical position, or at an angled position relative to the horizontal resting plane of the iron, the mercury switch is opened and the circuitry of the iron is configured to de-energize the heating element in the soleplate after a second predetermined period of time has elapsed when the iron remains in such a vertically oriented position.

Two apparent disadvantages are associated with the employment of the aforementioned mercury switch in an iron. First, during the initial start-up period in which the heating element is first energized, the heating element typically requires a prolonged period of time, such as two and a half (2.5) minutes to reach a selected optimum temperature for ironing. However, the aforementioned prior art iron employing a mercury switch may only initially heat-up when the iron is positioned in a vertical orientation, since when the iron is positioned motionless in a horizontal orientation, the heating element will de-energize after a short period of time, such as thirty (30) seconds. Thus, the prior art iron may only initially heat-up when it is positioned in a vertical orientation whereby the heating element must remain energized while the iron is vertically oriented for a period of time (i.e., two and half (2.5) minutes) which is sufficient to enable the soleplate to reach a selected optimum temperature. This is disadvantageous in that every time the iron is positioned in a vertical orientation, the heating element must remain energized for a prolonged period of time (i.e., two and half (2.5) minutes) before the heating element is automatically de-energized. This prolonged period of time may potentially create a dangerous situation since the energized soleplate is exposed while vertically oriented which may cause severe burns to a person who inadvertently contacts the exposed upstanding soleplate while the heating element is being energized. Further, the later time period may create a fire hazard whereby the unattended energized iron may be caused to fall from the ironing table when in a relatively unstable vertical position, and consequently come into contact with ignitable material.

Moreover, it has been found that many users prefer to allow the soleplate to initially heat up when the iron is positioned in a horizontal position, preferably in a fireproof tray suitable for such a purpose. It is noted that an advantage exists in permitting the iron to initially heat up while in a horizontal position, in that the iron is more stable in such a position in contrast to the less stable vertical position. It is thus readily apparent that an iron employing the aforementioned mercury switch is unable to permit the iron to initially heat up while disposed in a horizontal position, since energization of the heating element is only typically limited to twenty (20) seconds when an iron is to remain motionless in a horizontal orientation.

Secondly, an iron employing an aforementioned mercury switch is disadvantageous in that the reliability of its power switching circuit depends upon the functionability of the mercury switch. For example, when in a horizontal position, and when the user is operating the iron in smooth movements without great acceleration or deceleration for a prolonged period of time, the mercury switch may not change its state (from an open to a closed state and vice versa) causing the control circuit to incorrectly determine the iron is in a period of non-use resulting in the de-energization of the heated element. Furthermore, it is disadvantageous to employ the premise of movement to determine the energization of the heating element, as an unattended iron may be inadvertently moved, or may accidentally fall from the ironing board effecting the control circuit of the unattended iron to re-energize the heating element which may bring about a safety and fire hazard.

Another disadvantage which exists with the conventional iron is that the aforementioned bimetallic thermostat is prone to numerous setbacks. One such setback is that the effectiveness of the bimetallic thermostat to regulate temperature will decrease with time due to inherent metal fatigue within the bimetallic switching element. Further, the user often has to set the bimetallic thermostatic control at a considerably reduced temperature from the maximum at which the iron can be safely operated due to the well known fact that the soleplate temperature has a tendency to oscillate between a relatively low temperature when the soleplate is initially energized and at a relatively high temperature when the soleplate is initially de-energized. Such oscillations adversely effect the temperature regulation of the soleplate of the iron.

Accordingly, it is the primary object of the present invention to overcome the above-mentioned setbacks of a conventional iron utilizing the aforementioned mercury switch and/or bimetallic thermostatic control.

SUMMARY OF THE INVENTION

The present invention is directed towards an automatic switching apparatus for a hand held electrically operated appliance, such as a pressing iron. The automatic switching apparatus includes a power supply circuit preferably configured to electrically connect to an AC power source, such as a conventional wall outlet. An electronic drive circuit is coupled to the power supply circuit and is switchable between an activated state for electrically connecting the heating element of the iron to the AC power source so as to energize the appliance and a deactivated state for electrically disconnecting the AC power source from the electric appliance so as to de-energize the appliance.

A manually actuable switch, preferably a touch sensitive switch is coupled to the drive circuit and is responsive to facilitate selective activation of the drive circuit. The touch sensitive switch is preferably mounted on the handle portion of the iron and is operative to activate the drive circuit and energize the heating element when the switch is actuated, whereby the user maintains contact with the touch sensitive switch. When the switch is deactuated, whereby the user breaks contact with the touch sensitive switch, the switch is operative to deactivate the drive circuit and de-energize the heating element after a predetermined period of time.

A first timing circuit is coupled to the touch sensitive switch and drive circuit and is responsive to deactuation of the touch sensitive switch. The first timing circuit is configured to deactivate the drive circuit, resulting in de-energization of the heating element after expiration of a predetermined period of time, such as for example thirty (30) seconds, which begins to expire after the user has broken contact with the touch sensitive switch. As soon as the user retouches the touch sensitive switch, the drive circuit is immediately activated which correspondingly results in energization of the heating element and the first timing circuit is reset so as to only de-energize the heating element when the user once again breaks contact with the switch for another thirty (30) second period of time.

A second timing circuit is coupled to the first timing circuit and is responsive to disable the first timing circuit for a second predetermined period of time, such as for example two (2) minutes, when the power supply circuit is initially electrically connected to the AC power source. Essentially, when the iron is first plugged into a wall outlet, the second timing circuit disables the first timing circuit for two (2) minutes so as to enable the heating element to reach a sufficient temperature level sufficient for ironing without the above mentioned necessity of having the user maintain contact with the aforementioned touch sensitive switch. Only upon expiration of this second predetermined period of time, such as two (2) minutes, will the first timing circuit be enabled to de-energize the heating element, when the user breaks contact with, or never contacts the touch sensitive switch, for the first predetermined period of time, such as thirty (30) seconds.

Preferably, a temperature sensitive circuit is further provided and is coupled to the drive circuit and is responsive to deactivate the drive circuit and de-energize the heating element when the heating element of the iron is greater than a selected predetermined temperature. The temperature sensitive circuit preferably includes a thermistor thermally associated with the heating element and coupled to a solid state voltage inverter configured to determine when the temperature of the heating element equates with the selected predetermined temperature level. In particular, the temperature sensitive circuit is configured to deactivate the heating element independent of the aforementioned first and second timing circuits. Thus, even if the user is contacting the touch sensitive switch and the iron is plugged into the wall socket for a period of time which is less than the aforementioned second predetermined period of time, the temperature sensitive circuit is still enabled to de-energize the heating element if the temperature level of the heating element equates to the selected predetermined temperature level.

BRIEF DESCRIPTION OF THE DRAWINGS

The foregoing features of the present invention will become more readily apparent and may be understood by referring to the following detailed description of an illustrative embodiment of an apparatus according to the present invention, taken in conjunction with the accompanying drawings, in which.

DETAILED DESCRIPTION OF THE PREFERRED EMBODIMENT(S)

Figure 1:
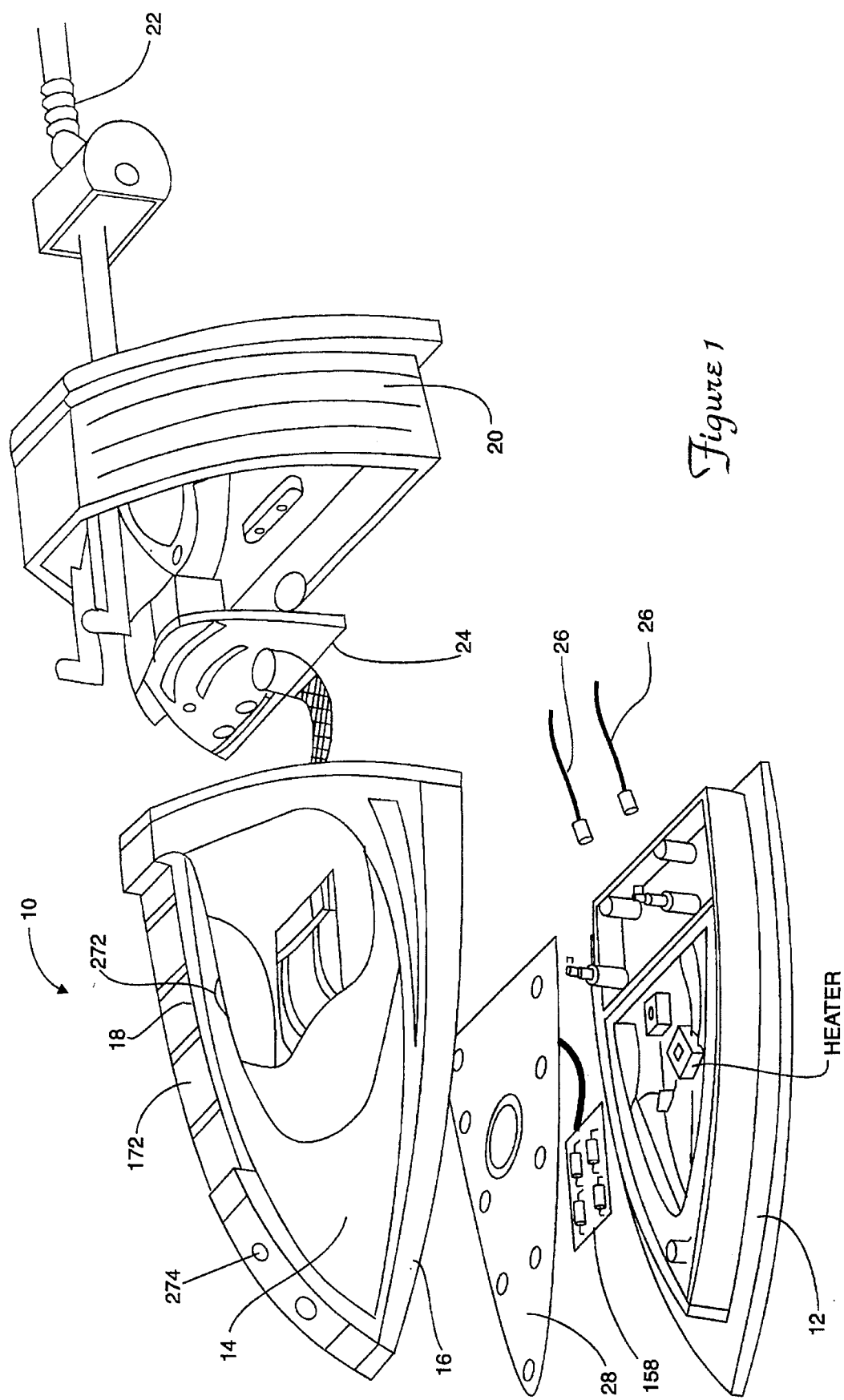
FIG. 1 illustrates an exploded perspective view of an electric appliance in the form of a pressing iron embodying the present invention.

Referring now to the drawings, in which like reference numerals identify similar or identical elements, FIG. 1 illustrates an iron shown generally at 10 of an essentially conventional design for illustrating the manner in which the present invention is to be employed. However, it is to be appreciated that the automatic switching apparatus of the present invention is not to be understood to be limited to such an iron 10, but rather it is to be understood that the automatic switching apparatus of the present invention may be adapted to be employed in many different types of electric appliances.

The conventional electric pressing iron 10 illustrated in FIG. 1 is provided with a soleplate 12, typically of cast aluminum, onto which is mounted a housing 14, typically of molded plastic. Housing 14 is insulated from soleplate 12 by an insulating plate 28. The housing 14 typically includes a bottom skirted portion 16 and a handle portion 18. An end panel or rear pedestal 20 is affixed to an end of the housing 14 and is adapted to enable the iron 10 to be positioned in a vertically oriented position. Extending from the rear of the handle portion 18 and top of the pedestal 20 is a line cord 22 for connecting the iron 10 to a source of AC power. A heating element, typically consisting of a cal-rod-type resistance wire heater, is affixed within the soleplate 12 and is configured to heat the soleplate 12 to a temperature suitable to press an article of clothing or various textiles. A number of user controls (not shown) including a temperature selector knob, steam actuator, and steam control button may be provided on the housing 14 for controlling such conventional functions as are well known.

A circuit board 24 preferably incorporating the automatic switching apparatus of the present invention is preferably affixed within the rear pedestal portion 20 of the housing 14. A pair of electrical wires 26 electrically connect the circuit board 24 to the heating element mounted within the soleplate 12 so as to enable the energization of the heating element when commanded to do so by the automatic switching apparatus, which will be discussed below.

The provision of the automatic switching apparatus within the circuitry of the circuit board 24 essentially provides a safety feature functional to automatically de-energize the heating element when the iron 10 is left unattended by the user for a prolonged period of time, whereby operation of the automatic switching apparatus is independent with respect to movement of the iron 10. A detailed discussion of the automatic switching apparatus will be provided hereinbelow.

Figure 2:
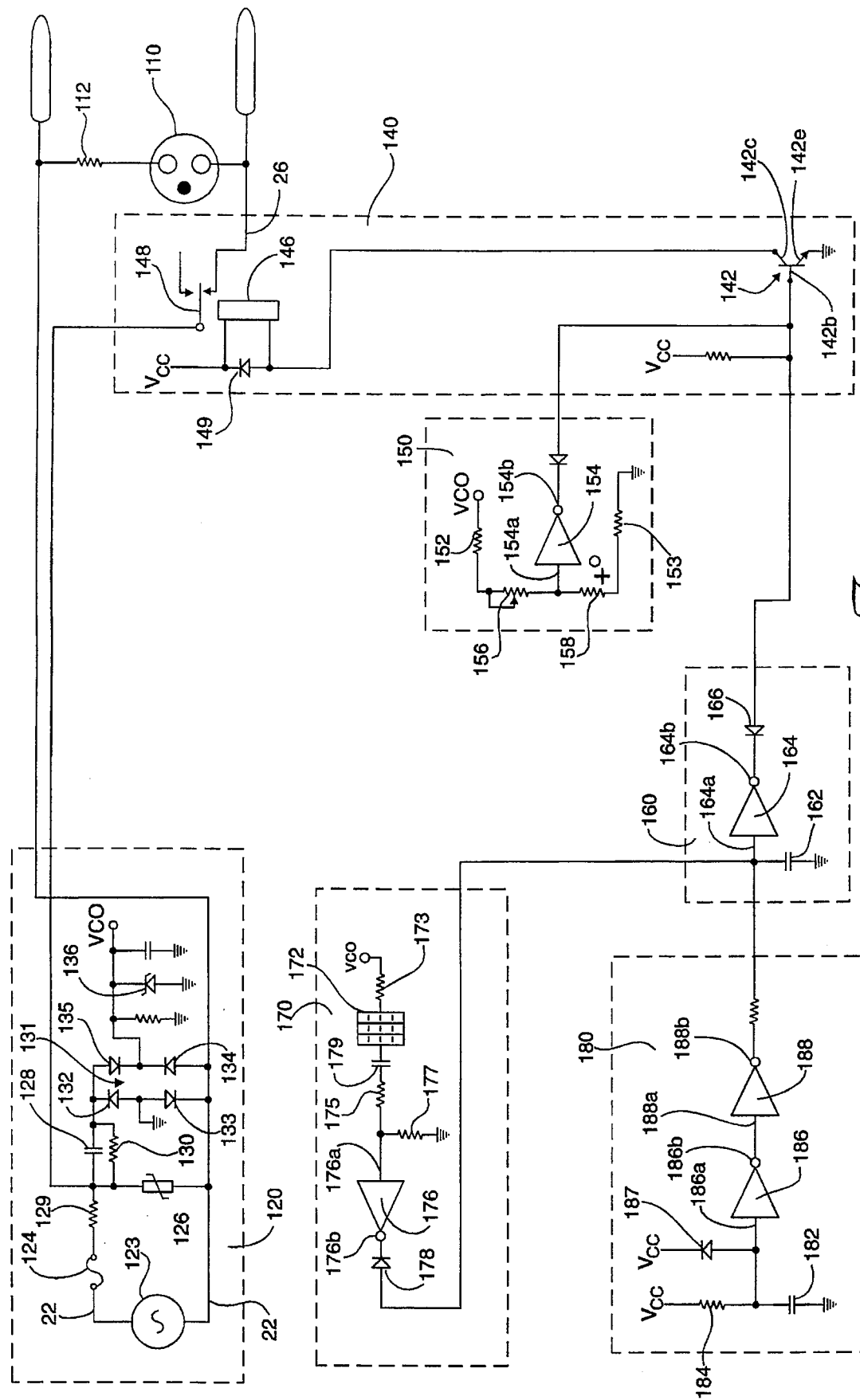
FIG. 2 is a schematic drawing of the automatic switching circuit of the present invention employed in the electric appliance of FIG. 1.

Referring now to FIG. 2, in conjunction with FIG. 1, there is shown a schematic circuit diagram illustrating the automatic switching circuit shown generally at 100 which includes the pair of electrical wires 26 connecting to the heating element (not shown) and a neon lamp 110 coupled to a current limiting resistor 112. The neon lamp 110 is functional to illuminate when AC current flows through the electrical wires 26 so as to energize the heating element to provide a visual indication that the unit is energized.

Basically, the automatic switching circuit may be viewed and described as a plurality of sub-circuits, which include a power supply circuit 120, a drive circuit 140, a temperature sensitive circuit 150, a first timing circuit 160, a touch sensitive circuit 170 and a second timing circuit 180. Each aforementioned circuit will now be discussed, in turn, hereinbelow.

The power supply circuit 120 includes the line cord 22 which connects the power supply circuit 120 to an alternating current (AC) power source 123, such as a conventional wall outlet (not shown). A fuse 124 is provided in line cord 22, as is conventional, along with a voltage suppressor 126 in parallel with the fuse 124. A capacitor 128 is coupled to the fuse 124 and voltage suppressor 126 through a current limiting resistor 129 and is functional to step down the voltage of the AC power source 123 to approximately 13 volts. A bleeding resistor 130 is connected in parallel with the capacitor 128 so as to provide a discharge path for the capacitor 128 when the line cord 22 is disconnected from the AC power source 123. A conventional diode bridge rectifier 131 consisting of diodes 132, 133, 134 and 135 is coupled to the capacitor 128 and is functional to convert alternating current (AC) to direct current (DC), as is well known. A zener diode 136 is coupled to the bridge rectifier 131 and is functional to clamp the voltage from the bridge rectifier 131 to approximately 12 volts thereby providing a DC power supply (VCC) 138. As will be appreciated below, VCC will be utilized to power the remaining circuits described hereinbelow.

The drive circuit 140, when activated, is operational to electrically connect the heating element, via line 26, to the AC power source 123 resulting in the energization of the heating element. The drive circuit 140 includes a steering transistor 142, which when turned ON, is operational to connect the heating element to the AC power source 123. To accomplish the aforementioned electrical connection, a conventional relay mechanism 144 is provided which includes an electromagnetic relay coil 146 and an electromagnetic switch 148. The electromagnetic switch 148 is coupled to line 26 and to the AC power supply 123, and when closed, electrically connects the AC power supply 123 to line 26 so as to energize the heating element. The relay coil 146 is coupled to VCC and to the collector 142C of the steering transistor 142, such that, when the transistor 142 is turned ON (effected from the flow of current from VCC to the base 142b of the transistor 142), current is effected to flow from VCC through relay coil 146 closing the electromagnetic switch 148, as is well known. Conversely, when the steering transistor 142 is OFF, no current from VCC flows through the relay coil 146, thus electromagnetic switch 148 is in its normally biased open position effecting de-energization of the heating element. A diode 149 is connected in parallel with the relay coil 146, and is functional for the bypass of high voltage transients during relay transition, as is conventional.

The temperature sensitive circuit 150 is essentially functional to turn OFF the steering transistor 142, and thus de-energize the heating element, via the drive circuit 140, as described above, when the heating element exceeds a chosen temperature. The temperature sensitive circuit 150 incorporates a voltage divider which is formed by resistors 152 and 153, potentiometer 156 and thermistor 158. Resistor 152 is coupled between VCC and the potentiometer 156, while the potentiometer 156 is also coupled to the input terminal 154a of a solid state voltage inverter 154. The resistor 153 is coupled between ground and the thermistor 158, with the thermistor 158 also being coupled to the input terminal 154a of the voltage invertor 154. As shown in FIG. 1, the thermistor 158 is preferably mounted in thermal contact with the soleplate 12. As is well known, the resistance of the thermistor 158 decreases as its ambient temperature increases. A diode 159 is coupled to the output terminal 154b of the voltage inverter 154 and the base 142b of the steering transistor 142. When the output terminal 154b of the voltage inverter 154 is logic low (0), current will flow through diode 159 from VCC causing steering transistor 142 to turn OFF which effectuates the heating element to de-energize, as described above.

In operation of the temperature sensitive circuit 150, the potentiometer 156 is functional to regulate the temperature of the heating element in the soleplate 12. The selected position (the preselected resistance) of the potentiometer 156 prescribes the amount of current flow through the thermistor 158 from VCC. As the temperature of the thermistor 158 increases, the voltage potential across thermistor 158 will correspondingly decrease (since the resistance of the thermistor 158 decreases correspondingly with the rise in temperature). As set forth above, the later voltage potential is applied to the input terminal 154a of the voltage inverter 154. When this voltage potential is greater than the threshold voltage of the voltage inverter 154, the output terminal 154b of the voltage inverter 154 is caused to go logic low (0) (current flows from VCC and through the diode 159) effecting the transistor 142 to turn OFF thus de-energizing the heating element, as described above. Therefore, when the user desires that the heating element be regulated at a desired temperature, the user adjusts the potentiometer 156 to a corresponding calibrated resistance which effects a corresponding current flow through the thermistor 158. The voltage potential across the thermistor 158 will only be less than the fixed threshold voltage of the inverter 154 when the thermistor 158 is exposed to a temperature which results in the thermistor 158 to have a resistance which results in a voltage potential (V=IR) less than the fixed threshold voltage of the inverter 154. Thus, when the temperature surrounding the thermistor 158 is greater than the desired regulated temperature, the output 154*b* of the inverter 154 is logic low (0) effecting the de-energization of the heating element. When the temperature surrounding the thermistor 158 is less than the desired regulated temperature, the output 154*b* of the inverter 154 is logic high (1) maintaining energization of the heating element, so long as the first timing circuit 160 does not de-energize the heating element, as will be described further below.

It is to be appreciated that the potentiometer 156 may be readily calibrated, such that a particular selected resistance of the potentiometer 156 will correspond to the thermistor 158 to have a voltage potential equal to the threshold voltage of the inverter 154 when the heating element equates with a particular desired temperature which is directly correlated with the selected resistance of the potentiometer 156.

The first timing circuit 160 and the touch sensitive circuit 170 are functional to de-energize the heating element when the iron is left unattended for a predetermined period of time. The first timing circuit 160 includes a timing capacitor 162 coupled to the input terminal 164*b* of a solid state voltage inverter 164. The output terminal 164*b* of the voltage inverter 164 is coupled to a diode 166 which is further connected to the base 142*b* of the steering transistor 142.

The first timing circuit 160 de-energizes the heating element when the voltage potential of the timing capacitor 162 is equal to the voltage threshold of the inverter 164 effecting the output terminal 164*b* of the inverter 164 to be logic low (0). Thus, when the output terminal 164*b* of the inverter 164 is logic low (0), current will flow from VCC through diode 166 causing transistor 142 to turn OFF, causing de-energization of the heating element, as described above.

The touch sensitive circuit 170 is operational to effect the aforementioned first timing circuit 160 to de-energize the heating element after a user's hand has been removed from the handle portion 18 (FIG. 1) for a predetermined period of time. The touch sensitive circuit 170 includes a touch sensitive switch 172 coupled to VCC through a current limiting resistor 173. The touch sensitive switch 172 is preferably mounted to the handle portion 18, as shown in FIG. 1, and is operational to be in a closed state when touched by the user and in an open state when untouched by the user. The touch sensitive switch 172 is further coupled to the input terminal 176*a* of a solid state voltage inverter 176 through a capacitor 179 and a voltage divider comprising resistors 175 and 177. The output terminal 176*b* of the voltage inverter 176 is coupled to a diode 178 which is coupled to the timing capacitor 162 and the input terminal 164*a* of the voltage inverter 164.

When the touch sensitive switch 172 is touched by the user (the iron 10 is being used), VCC is applied to the input terminal 176*a* of voltage inverter 176, whereby VCC is greater than the threshold voltage of the inverter 176 causing its output terminal 176*b* to be logic low (0). With the output terminal 176*b* of the inverter 176 logic low (0), current is effected to flow from VCC in the second timing circuit 180 through diode 178. Hence, current will not charge timing capacitor 162 which effects the output terminal 164*b* of the inverter 164 to be logic high (1) causing transistor 142 to be turned ON so long as the temperature sensitive circuit 150 does not turn OFF transistor 142, as described above. Further, when the touch sensitive switch 172 is closed, any voltage charge stored in timing capacitor 162 will also be dissipated through diode 178 and timing capacitor 162 will not recharge until such a time when the touch sensitive switch 172 is open, the significance of which will be described below. Thus, when the user contacts the touch sensitive switch 172, the heating element will be energized so long as the heating element is not above its regulated temperature.

When the touch sensitive switch 172 is not touched by the user (the iron is not being used), the switch 172 is open and current from VCC in the second timing circuit 180 is effected to charge the timing capacitor 162. When the stored voltage potential in the timing capacitor 162 is equal to the threshold voltage of the inverter 164, transistor 142 is effected to turn OFF and de-energize the heating element, as described above.

The timing capacitor 162 is configured to have a stored voltage potential which equals the threshold voltage of the inverter 164 after a predetermined period of time in dependence upon its capacitance, as is well known. Preferably, the timing capacitor 162 is to be configured to have a capacitance which enables it to charge up to equal the threshold voltage level of the inverter 164 within thirty (30) seconds. Thus, when the user removes his/her finger away from the touch sensitive switch 172, the heating element will de-energize after expiration of the aforementioned thirty (30) second time period which began to expire after the user removed his/her finger away from the touch sensitive switch 172 (whereafter the capacitor 162 is charged to a voltage level equal to the threshold voltage of the inverter 167). As soon as the user retouches the touch sensitive switch 172, the timing capacitor 162 will be effected to fully discharge through diode 178, as mentioned above, thus resetting the first timing circuit 160, such that, when the user once again breaks contact with the touch sensitive switch 172, the heating element will only be de-energized after the expiration of another thirty (30) second time period.

The second timing circuit 180 is functional to enable the heating element to remain energized after the iron is initially connected to the AC power supply 123 for a predetermined period of time, such as two (2) minutes, which is sufficient to enable the heating element to reach a desired regulated temperature level. The second timing circuit 180 includes a timing capacitor 182 connected to VCC through resistor 184. Diode 187 is also coupled to the timing capacitor 182 and is functional to provide a current discharge path when the iron 10 (the line cord 22) is disconnected from the AC power source 123. Timing capacitor 182 is connected to the input terminal 186*a* of a solid state voltage inverter 186 which is connected in series with another solid state voltage inverter 188. The output terminal 188*b* of voltage inverter 188 is coupled to timing capacitor 162 and diode 178. Timing capacitor 162 will only charge when the output terminal 188*b* of voltage inverter 188 is logic high (1) which is effected when the input terminal 186*a* of voltage inverter 186 is also logic high (1). The input terminal 186*a* of the voltage inverter 186 is logic high (1) when the stored voltage potential of the timing capacitor 182 is greater than the threshold voltage level of the voltage inverter 186.

The timing capacitor 182 is configured to have a stored voltage potential which equates with the threshold voltage level of the voltage inverter 186 after a predetermined period of time in dependence upon its capacitance, as is well known. Preferably, the timing capacitor 182 is to be configured to have a capacitance which enables it to charge tip to a voltage level which equates with the threshold voltage level of the inverter 186 within two (2) minutes after the line cord 22 is connected to the AC power source 123.

Thus, when the line cord 22 is initially connected to the AC power source 123, the first timing circuit 160 will be disabled for a two (2) minute start-up period of time. Specifically, timing capacitor 162 will not charge during this two (2) minute period, irregardless of the state of the touch sensitive switch 172 as it will not receive current flow from VCC.

After expiration of the start-up two (2) minute period of time, the first timing circuit 160 is enabled, and specifically, the timing capacitor 162 is enabled to store a voltage charge from VCC when the touch sensitive switch 172 is not touched by the user, as fully described above. For example, immediately after the expiration of the two (2) minute start-up period of time, if the user is not contacting the touch sensitive switch 172, the first timing circuit 160 may only turn OFF transistor 142 and de-energize the heating element after another additional thirty (30) seconds (the time required to charge timing capacitor 162 to equate with the threshold voltage level of inverter 164). Thus, a time period of two (2) minutes and thirty (30) will have elapsed before the heating element is de-energized, which in most instances is a sufficient period of time to heat the heating element to any prescribed regulated heating level. Of course, if the temperature of the heating element equates with the selected heat level, via the potentiometer 156, the temperature sensitive circuit 150 is enabled to de-energize the heating element until such a time when the heating element is below the prescribed regulated heating level as fully discussed above.

It is contemplated that a manually actuated switch may be coupled the timing capacitor 182 and ground. When actuated, the switch is operative to electrically connect the capacitor 182 to ground so as discharge the capacitor 182, which in turn effects the second timing circuit 180 to disable the first timing circuit 160, as described above. For example, when the iron is left unattended for a substantial period of time, such as ten (10) minutes, the heating element will have remained de-energized for a prolong period of time and will be of a temperature which is insufficient for ironing. However, the user merely has to activate the aforementioned manually actuated switch, in contrast to unplugging and re-plugging in the iron, so as to reset the second timing circuit 180 provide another two (2) minute start-up period of time sufficient to reheat the heating element without necessitating the user to remain in contact with the touch sensitive switch 172 during such a warm-up period, as described above.

It is to be appreciated that the aforementioned time periods for respectively the first and second timing circuits 160 and 180 are only examples of such time periods, as it is to be understood that the first and second timing circuits 160 and 180 may respectively function in conjunction with any time period suitable to accomplish its respective safety aspect. For example, the first timing capacitor 162 may have a capacitance which enables the first timing circuit 160 to de-energize the heating element after the user has broken contact with the touch sensitive switch 172 for a time period of forty five (45) seconds. Further, the second timing capacitor 182 of the second timing circuit 180 may have a capacitance which disenables the first timing circuit 160 for a period of three (3) minutes after the line cord 22 is initially connected to the AC power source 123. It is also contemplated the respective time periods of the first and second tinning circuits 160 and 180 may be selectively prescribed by the user so as to be tailored to the user's needs.

Although the present invention has been described with emphasis on a particular embodiment for carrying out automatic deactivation and temperature regulation of an electric pressing iron, it should be understood that the figures are for illustration of a preferred embodiment of the present invention only and should not be taken as limitations or thought to be the only means of carrying out the present invention. For example, touch sensitive switch 172 may comprise a touch sensitive switch as described above, or alternately, switch 172 may be an interlock type mechanical switch, a heat sensitive switch, a light sensitive switch, etc. It is contemplated that many changes and modifications may be made to the present invention without departure from the spirit and scope of the invention as disclosed above.

What is claimed is:

1. An automatic switching apparatus for supplying electrical power to an electric appliance, de-energizing a heating element of said appliance after detecting non-use of said appliance for a predetermined time period, and de-energizing said heating element after temperature of said heating element is equal to a predetermined temperature, said appliance including means for coupling said switching apparatus to a source of electrical power, said switching apparatus comprising:

a) a drive circuit switchable between an activated state for electrically connecting said appliance to said source of electrical power and a deactivated state for electrically disconnecting said appliance from said source of electrical power;

b) a manually actuable switch coupled to said drive circuit, said manually actuable switch switchable between a first actuated state operable to switch said drive circuit to said activated state, and a second deactuated state operable to switch said drive circuit to said deactivated state;

c) a first timing circuit operable to cause said drive circuit to switch to said deactivated state when said manually actuable switch is in said second deactuated state for said predetermined period of time, and said manually actuable switch being further operable to activate said drive circuit to reset said first timing circuit when said manually actuable switch is switched to said first actuated state; and d) a temperature sensitive circuit operative to deactivate said drive circuit in response to said predetermined temperature by switching said drive circuit to said deactivated state when temperature of said heating element equals said predetermined temperature and operative to activate said drive circuit by switching said drive circuit to said activated state when temperature of said heating element is less than said predetermined temperature.

2. An automatic switching apparatus as recited in claim 1, further comprising a second timing circuit operable to disable said first timing circuit for a second predetermined period of time when said coupling means is initially electrically connected to said source of electrical power.

3. An automatic switching apparatus as recited in claim 2, wherein operation of said first and second timing circuits are independent of the orientation and movement of the electric appliance.

4. An automatic switching apparatus as recited in claim 2, wherein said first and second timing circuits respectively include first and second timing capacitors, wherein the capacitance of each respective timing capacitor determines respectively, the first and second predetermined periods of time.

5. An automatic switching apparatus as recited in claim 1, wherein said temperature sensitive circuit includes a thermistor mounted in thermal contact with a heating element located within said electric appliance.

6. An automatic switching apparatus as recited in claim 1, wherein said manually actuable switch is a touch sensitive switch which is in said first actuated state when contacted by a user and in said second deactuated state when contact by the user is interrupted.

7. An automatic switching apparatus as recited in claim 6, wherein said drive circuit includes a steering transistor responsive to electrically connect said electric appliance with said source of electrical power.

8. An automatic switching apparatus for supplying electrical power to an electric appliance, de-energizing a heating element of said appliance after detecting non-use of said appliance for a predetermined time period, and de-energizing said heating element after temperature of said heating element is equal to a predetermined temperature, said appliance including means for coupling said switching apparatus to a source of electrical power, said switching apparatus comprising:

a) a drive circuit switchable between an activated state for electrically connecting said appliance to said source of electrical power and a deactivated state for electrically disconnecting said appliance from said source of electrical power;

b) a touch sensitive circuit coupled to said drive circuit, said touch sensitive circuit switchable between a first actuated state operable to switch said drive circuit to said activated state when contacted by a user, and a second deactuated state operable to switch said drive circuit to said deactivated state when contact by the user is interrupted;

c) a first timing circuit operable to cause said drive circuit to switch to said deactivated state when said touch sensitive circuit is in said second deactuated state for said predetermined period of time, and said touch sensitive circuit being further operable to activate said drive circuit to reset said first timing circuit when said touch sensitive circuit is in said first actuated state;

d) a second timing circuit coupled to said first timing circuit and responsive to disable said first timing circuit for a second predetermined period of time when said coupling means is initially electrically connected to said source of electrical power; and e) a temperature sensitive circuit coupled to said drive circuit and operative to deactivate said drive circuit in response to when said heating element of said appliance is of a temperature approximately equal to said predetermined temperature.

9. An automatic switching apparatus as recited in claim 8, wherein said power supply means includes:

i) an AC power connecting means; and ii) a DC power supply.

10. An automatic switching apparatus as recited in claim 9, wherein said drive circuit is powered by said DC power supply and includes:

iii) an electromagnetic relay mechanism responsive upon activation to electrically connect said AC power connecting means to said electric appliance; and iv) a steering transistor coupled to said electromagnetic relay mechanism and responsive to activate said relay mechanism when said transistor is ON and deactivate said relay switch when said transistor is OFF.

11. An automatic switching apparatus as recited in claim 10, wherein said touch sensitive circuit includes:

v) a touch sensitive switch coupled to said DC power supply, whereby said switch is actuated when a user contacts said switch and said switch is deactuated when contact is interrupted between a user and said switch; and vi) a first voltage inverter coupled to said touch sensitive switch and to said first timing circuit.

12. An automatic switching apparatus as recited in claim 11, wherein said first timing circuit includes:

vii) a first timing capacitor coupled to said first voltage inverter wherein the capacitance of the first timing capacitor determines the first predetermined period of time; and viii) a second voltage inverter coupled to said steering transistor and said first timing capacitor and operative to turn OFF said steering transistor in response to deactuation of said touch sensitive switch upon expiration of the first predetermined period of time.

13. An automatic switching apparatus as recited in claim 12, wherein said second timing circuit includes:

ix) a second timing capacitor coupled to said DC power supply wherein the capacitance of the second timing circuit determines the second predetermined period of time;

x) a third voltage inverter coupled to said second timing circuit; and xi) a fourth voltage inverter coupled to said third voltage inverter, said first timing capacitor and said second voltage inverter, said fourth voltage inverter operative to turn ON said steering transistor and disable said first timing circuit during the second predetermined period of time when said AC power connecting means is initially electrically connected to an AC power source.

14. An automatic switching apparatus as recited in claim 13, wherein said first and second timing capacitors respectively have a capacitance which respectively correlate to said first predetermined period of time being equal to or less than thirty (30) seconds and said second predetermined period of time being equal to or greater than two (2) minutes.

15. An automatic switching apparatus as recited in claim 8, wherein said temperature sensitive circuit includes:

xii) a potentiometer coupled to said DC power supply;

xiii) a thermistor coupled to said potentiometer and mounted in thermal contact with said heated element of said appliance; and xiv) a fifth voltage inverter coupled to said thermistor and to said steering transistor and operative to turn OFF said steering transistor when said thermistor is greater than a predetermined temperature, and is further operative to turn ON said steering transistor when said thermistor is less than or equal to said predetermined temperature.

16. In an electric pressing iron including electrical connecting means for electrically connecting said iron to a source of electrical power, a soleplate, a heating element in thermal contact with said soleplate, a temperature control means in thermal and electrical contact with said heating element for selecting temperature of said heating element, and a housing defining a handle portion, the improvement which comprises: a drive circuit switchable between an activated state for electrically connecting said heating element to said electrical connecting means and a deactivated state for electrically disconnecting said heating element from said electrical connecting means, a touch sensitive circuit coupled to said drive operative to selectively activate said drive circuit in response to actuation of said touch sensitive circuit, a first timing circuit responsive to deactuation of said touch sensitive circuit and operative to deactivate said drive circuit when said touch sensitive circuit is deactuated for a predetermined period of time and responsive to actuation of said touch sensitive circuit to activate said drive circuit, and a temperature sensitive circuit operative to deactivate said drive circuit in response to when said heating element is greater than a predetermined temperature as selected by said temperature control means.

17. An electric pressing iron as recited in claim 16, wherein said drive circuit further comprises a second timing circuit operative to disable said first timing circuit for a second predetermined period of time when said electrical connecting means is initially electrically connected to said source of electrical power.

18. An electric pressing iron as recited in claim 16, wherein said touch sensitive circuit includes a touch plate disposed on said handle of iron.

* * * * *